US006967358B2

(12) United States Patent

Nemati et al.

(10) Patent No.: US 6,967,358 B2
(45) Date of Patent: *Nov. 22, 2005

(54) THYRISTOR-TYPE MEMORY DEVICE

(75) Inventors: Farid Nemati, Stanford, CA (US); James D. Plummer, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/777,453

(22) Filed: Feb. 12, 2004

(65) Prior Publication Data

US 2004/0159853 A1 Aug. 19, 2004

Related U.S. Application Data

(63) Continuation of application No. 10/103,241, filed on Mar. 20, 2002, now Pat. No. 6,727,529, which is a continuation of application No. 10/103,240, filed on Mar. 20, 2002, now Pat. No. 6,528,356, which is a continuation of application No. 09/666,825, filed on Sep. 21, 2000, now Pat. No. 6,448,586, which is a continuation of application No. 09/092,449, filed on Jun. 5, 1998, now Pat. No. 6,229,161.

(51) Int. Cl.[7] .............................................. H01L 29/423

(52) U.S. Cl. ........................ 257/133; 257/133; 257/135

(58) Field of Search ................................ 257/133, 135, 257/155, 147, 105, 115; 365/180, 154

(56) References Cited

U.S. PATENT DOCUMENTS 3,863,229 A * 1/1975 Gersbach .................... 365/180
3,918,033 A 11/1975 Case et al.
3,986,177 A 10/1976 Picquendar et al.
4,090,254 A 5/1978 Ho et al.
4,146,902 A 3/1979 Tanimoto et al.
4,590,589 A 5/1986 Gerzberg
4,612,448 A 9/1986 Strack
4,677,455 A 6/1987 Okajima
4,959,703 A 9/1990 Ogura et al.
5,321,285 A 6/1994 Lee et al.
5,324,966 A 6/1994 Muraoka et al.
5,390,145 A 2/1995 Nakasha et al.
5,396,454 A 3/1995 Nowak
5,412,598 A 5/1995 Shulman
5,464,994 A 11/1995 Shinohe et al.

(Continued)

FOREIGN PATENT DOCUMENTS

FR 2 110 326 A 6/1972
JP 57 208177 A 12/1982

OTHER PUBLICATIONS

F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA., 1999.

(Continued)

*Primary Examiner*—Michael Tran
*Assistant Examiner*—Thinh T Nguyen

(57) ABSTRACT

A thyristor device can be used to implement a variety of semiconductor memory circuits, including high-density memory-cell arrays and single cell circuits. In one example embodiment, the thyristor device includes doped regions of opposite polarity, and a first word line that is used to provide read and write access to the memory cell. A second word line is located adjacent to and separated by an insulative material from one of the doped regions of the thyristor device for write operations to the memory cell, for example, by enhancing the switching of the thyristor device from a high conductance state to a low conductance state and/or from the low conductance state to the high conductance. This type of memory circuit can be implemented to significantly reduce standby power consumption and access time.

22 Claims, 9 Drawing Sheets

U.S. PATENT DOCUMENTS

| | | | | |
|---|---|---|---|---|
| 5,471,419 | A | 11/1995 | Sankaranarayanan et al. | |
| 5,525,820 | A | 6/1996 | Furuyama | |
| 5,543,652 | A | 8/1996 | Ikeda et al. | |
| 5,587,944 | A | 12/1996 | Shen et al. | |
| 5,689,458 | A | 11/1997 | Kuriyama | |
| 5,874,751 | A | 2/1999 | Iwamuro et al. | |
| 5,910,738 | A | 6/1999 | Shinohe et al. | |
| 5,914,503 | A | 6/1999 | Iwamuro et al. | |
| 5,936,267 | A | 8/1999 | Iwamuro | |
| 5,939,736 | A | 8/1999 | Takahashi | |
| 5,981,984 | A | 11/1999 | Iwaana et al. | |
| 6,229,161 | B1 * | 5/2001 | Nemati et al. | 257/133 |
| 6,448,586 | B1 | 9/2002 | Nemati et al. | |
| 6,528,356 | B2 | 3/2003 | Nemati et al. | |
| 6,727,529 | B2 * | 4/2004 | Nemati et al. | 257/133 |

OTHER PUBLICATIONS

F. Nemati and J.D. Plummer, *A Novel High Density, Low Voltage SRAM Cell with a Vertical NDR Device*, Center for Integrated Systems, Stanford University, Stanford, CA 94305.

F. Nemati and J.D. Plummer, *A Novel Vertical Storage SRAM Cell*, Student Paper written for Center for Integrated Systems, Stanford University, Stanford, CA 94305.

Baliga, B.Jayant, *Modem Power Devices*, pp. 349–350.

S. M. Sze, *Physics of Semiconductor Devices Second Edition*, John Wiley & Sons, pp. 198–209, 1981.

Plummer, James D. and Scharf, Brad W., *Insulated–Gate Planar Thyristors: I–Structure and Basic Operation*, pp. 380–386.

* cited by examiner

THYRISTOR-TYPE MEMORY DEVICE

RELATED PATENT DOCUMENTS

This is a continuation of U.S. patent application Ser. No. 10/103,241, filed on Mar. 20, 2002, now U.S. Pat. No. 6,727,529 which is a continuation of U.S. patent application Ser. No. 10/103,240, filed Mar. 20, 2002, now U.S. Pat. No. 6,528,356, which is a continuation of U.S. patent application Ser. No. 09/666,825, filed on Sep. 21, 2000, now U.S. Pat. No. 6,448,586, which is a continuation of Ser. No. 09/092,449, filed on Jun. 5, 1998, now U.S. Pat. No. 6,229,161, to which priority is claimed under 35 U.S.C. §120.

The Government has certain rights in this invention which was made with Government support under contract MDA972-95-1-0017 awarded by the Defense Research Projects Agency.

FIELD OF THE INVENTION

The present invention is directed to the construction and manufacture of semiconductor-type memory devices.

BACKGROUND

The electronics industry continues to strive for high-powered, high-functioning circuits. Significant achievements in this regard have been realized through the fabrication of very large-scale integration of circuits on small areas of silicon wafers. Integrated circuits of this type are manufactured through a series of steps carried out in a particular order. The main objectives in manufacturing many such devices include obtaining a device that occupies as small an area as possible and consuming low levels of power using low supply levels, while performing at speeds comparable to speeds realized by much larger devices. To obtain these objectives, steps in the manufacturing process are closely controlled to ensure that rigid requirements, for example, of exacting tolerances, quality materials, and clean environment, are realized.

An important part in the circuit construction, and in the manufacture, of semiconductor devices concerns semiconductor memories; the circuitry used to store digital information. The construction and formation of such memory circuitry typically involves forming at least one storage element and circuitry designed to access the stored information. In applications where circuit space, power consumption, and circuit speed are primary design goals, the construction and layout of memory devices can be very important.

Conventional random access memory devices, such as SRAM and DRAM, often compromise these primary design goals. SRAMs, for example, include circuit structures that compromise at least one of these primary design goals. A conventional SRAM based on a four-transistor ("4T") cell or a six-transistor ("6T") cell has four cross-coupled transistors or two transistors and two resistors, plus two cell-access transistors. Such cells are compatible with mainstream CMOS technology, consume relatively low levels of standby power, operate at low voltage levels, and perform at relatively high speeds. However, the 4T and 6T cells are conventionally implemented using a large cell area; and this significantly limits the maximum density of such SRAMs.

Other SRAM cell designs are based on NDR (Negative Differential Resistance) devices. They usually consist of at least two active elements, including an NDR device. The NDR device is important to the overall performance of this type of SRAM cell. A variety of NDR devices have been introduced ranging from a simple bipolar transistor to complicated quantum-effect devices. The biggest advantage of the NDR-based cell is the potential of having a cell area smaller than 4T and 6T cells because of the smaller number of active devices and interconnections. Conventional NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; and manufacturability and yield issues due to complicated fabrication processing.

NDR devices such as thyristors are also widely used in power control applications because the current densities carried by such devices can be very high in their on state. However, a significant difficulty with these devices in such applications is that once switched to their on-state, they remain in this state until the current is reduced below the device holding current. Also, in general, when the main current is interrupted, the time required for the thyristor to return to the blocking (OFF) state is largely determined by the carrier lifetime and can be quite long. This inability to switch the device off without interrupting the current and the associated slow switching speed are significant problems in many applications and have resulted in many attempts to modify the device structures so that it can be actively and rapidly switched off.

SUMMARY

One aspect of the present invention is directed to a thyristor-type device that alleviates one or more of the above-mentioned problems present in memory devices.

According to one example embodiment, the present invention is directed to a semiconductor memory device that includes a thyristor device with oppositely polarized regions. The memory device further includes a first word line providing read and write access to the memory cell, and a second word line located adjacent to and separated by an insulative material from at least one of the doped regions of the thyristor device. The second word line is used for memory cell write operations that can occur by enhancing the switching of the thyristor device from a high conductance state to a low conductance state and from the low conductance state to the high conductance state.

According to another example embodiment, the present invention is directed to a memory array that includes first and second word lines and a plurality of memory cells, each of which has a thyristor device including doped regions of opposite polarity. For each such memory cell, the first word line provides read and write access, and a portion of the second word line is located adjacent to and is separated by an insulative material from at least one of the doped regions of the thyristor device and used for write operation to the memory cell.

The above summary of the present invention is not intended to characterize each disclosed embodiment of the present invention. Among various other aspects contemplated as being within the scope of the claims, the present invention is also directed to methods of manufacturing the above structures and their respective circuit layouts.

BRIEF DESCRIPTION OF THE DRAWINGS

The invention may be more completely understood in consideration of the detailed description of various embodiments of the invention in connection with the accompanying drawings, in which.

Figure 1:
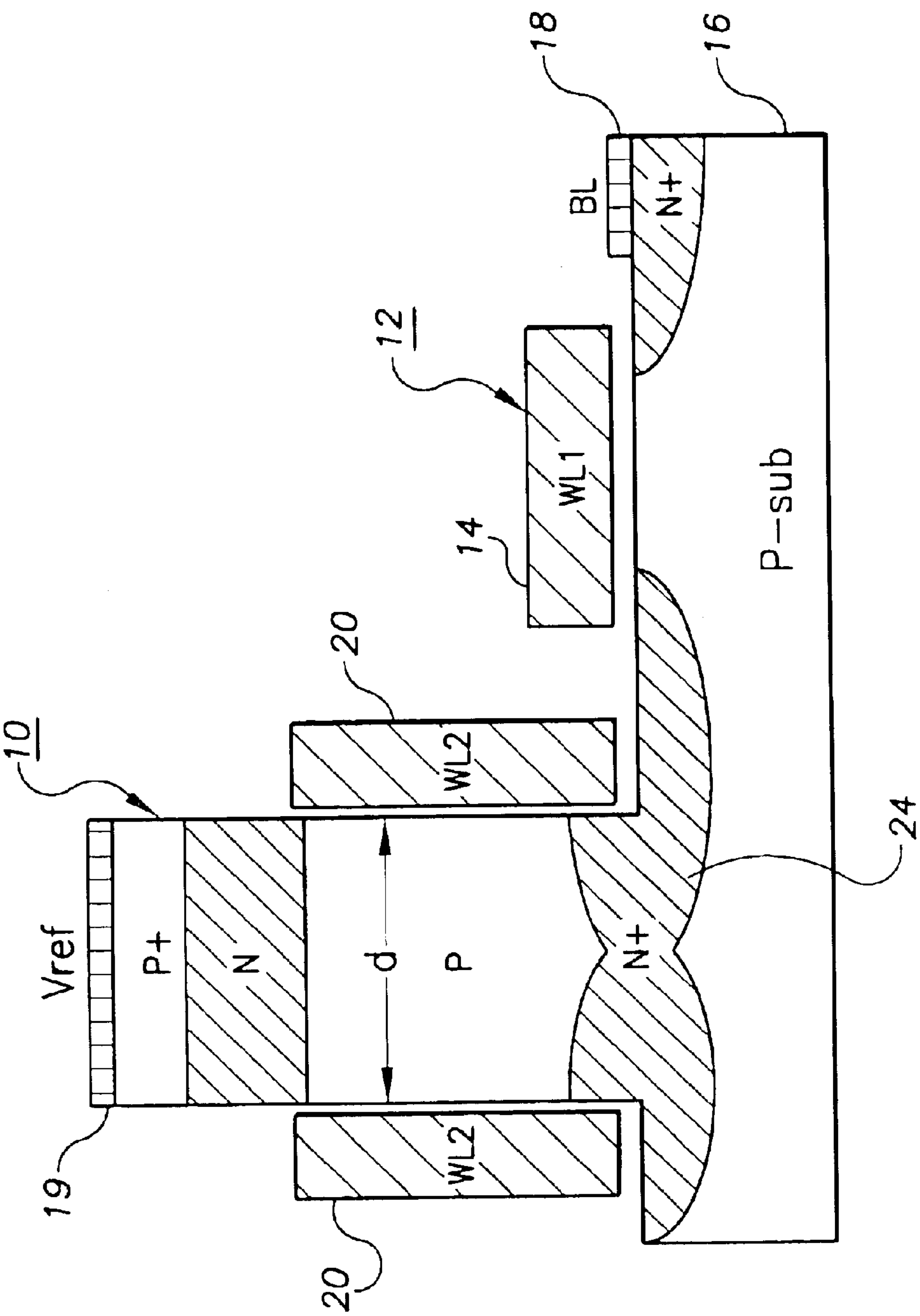
FIG. 1 illustrates a structural diagram, an example capacitively coupled NDR device in an SRAM cell arrangement, consistent with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is directed to capacitively coupled NDR devices, such as multiple PN-type structures, and circuit applications thereof. The present invention has been found to be particularly advantageous for designs in need of NDR devices having improved on/off switching speed, and a low holding current in the on state. Unlike many NDR devices such as conventional thyristor structures that slowly turn-off due to the saturation of their junctions in the on state, and/or which may not turn off at all until the current is reduced below the holding current, one aspect of the present invention is directed to such a device that quickly switches between a current-passing mode and a current-blocking mode in response to a capacitively-coupled activation signal being present adjacent to at least one of the regions of the capacitively coupled NDR device. In addition, such a change can occur using a relatively low voltage, and the device can be implemented in a relatively small area.

A particular example embodiment of the present invention is directed to an NDR device that uses a capacitively-coupled gate adjacent to the NDR device. The location and construction of the NDR device and the gate are such that a voltage transition presented at the gate causes the NDR structure to improve the speed of the current switching.

Figure 2:
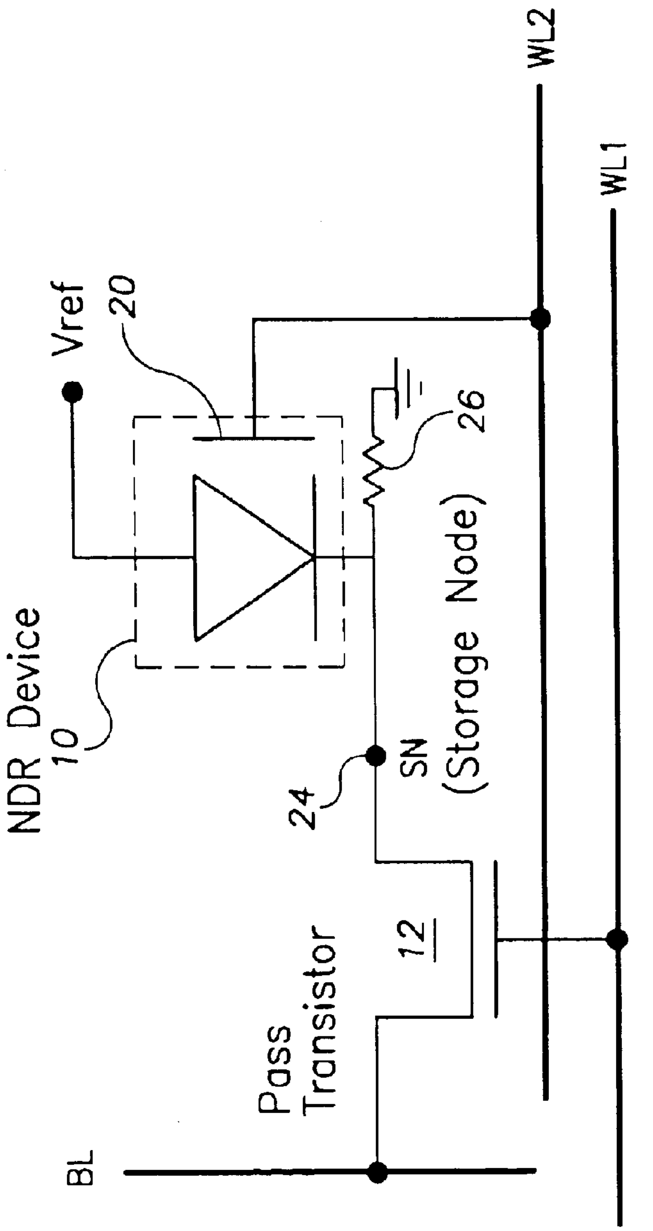
FIG. 2 illustrates a circuit diagram of the example arrangement of FIG. 1, consistent with the present invention.

Turning now to the drawings, FIGS. 1 and 2 respectively illustrate a structural diagram and a corresponding circuit diagram of an example SRAM cell arrangement that uses a capacitively coupled NDR device, according to the present invention. The example arrangement shown in FIG. 1 can be referred to as a thyristor based SRAM cell or T-RAM cell. The cell consists of two elements: a PNPN-type NDR device 10 and an NMOS-type access (or pass) transistor 12. The access (or pass) transistor 12 includes a gate 14 that forms part of a first word-line WL1 and N+ drain and source regions in a substrate 16, with one of the N+ drain and source regions connected to a bit-line (BL) 18. At the top of the vertical NDR device 10 is a metalization layer 19 that is used for connecting the top terminal of the device to a supply or reference voltage, Vref. The NDR device 10 is made vertically on top of a portion of the access transistor 12, over the source or drain that is not connected to the bit-line 18. The NDR device could also be fabricated adjacent to the access transistor.

The NDR device 10 has a middle P region adjacent to, and in a particular example embodiment surrounded by, a charge plate, or gate-like device, 20. The plate 20 forms part of a second word line (WL2) and is used to enhance switching between the cell's two stable states: the OFF state, where the device 10 is in a current-blocking mode; and the ON state, where the device 10 is in a current-passing mode. The voltage of the storage node 24 is at its high value for the ON state, and the holding current of the NDR device is provided by the subthreshold current of the access transistor 12.

FIG. 2 also shows a resistor 26 for an alternative embodiment, the resistor 26 being used to help maintain the holding current for the NDR device in its ON state. Although this approach increases the cell area, the approach is advantageous in that it may provide better controllability for the standby current in the cell.

In the illustrated example, the plate 20 overlaps the lower N+ region but not the upper N region. The PNPN device is sufficiently thin so that the gate has tight control on the potential of the P region of the PNPN and this potential can be modulated by the capacitive coupling via the plate 20. The lower N+ region is the internal node of the cell and corresponds to the storage node 24 of FIG. 2. The upper P+ region is connected to a reference voltage. WL2 is used for write operations and, more particularly, to speed up the device 10 turn-off when writing a logical zero to the cell and to enable the device 10 to turn-on at low voltages when writing a logical one to the cell. In standby mode, the word-lines and the bit-line are inactive or at their low voltage levels (which can be different for each line).

Figure 3B:
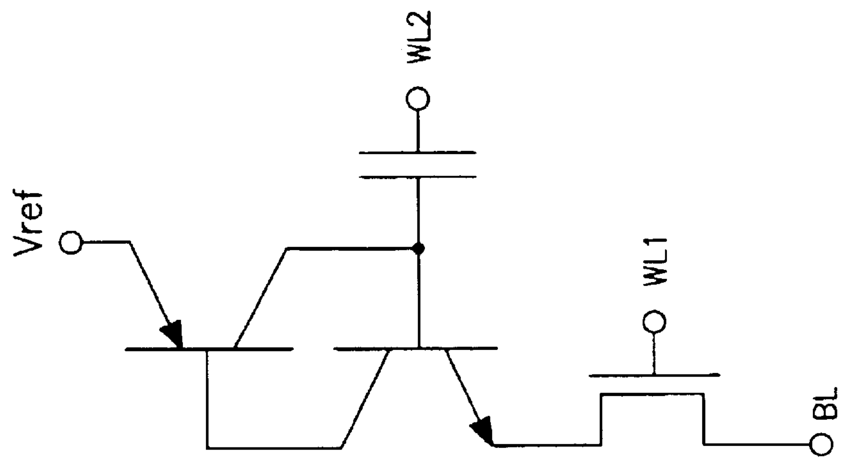
FIGS. 3*a* and 3*b* respectively illustrate DC and AC equivalent circuits of the example arrangement of FIG. 1.
Figure 3A:
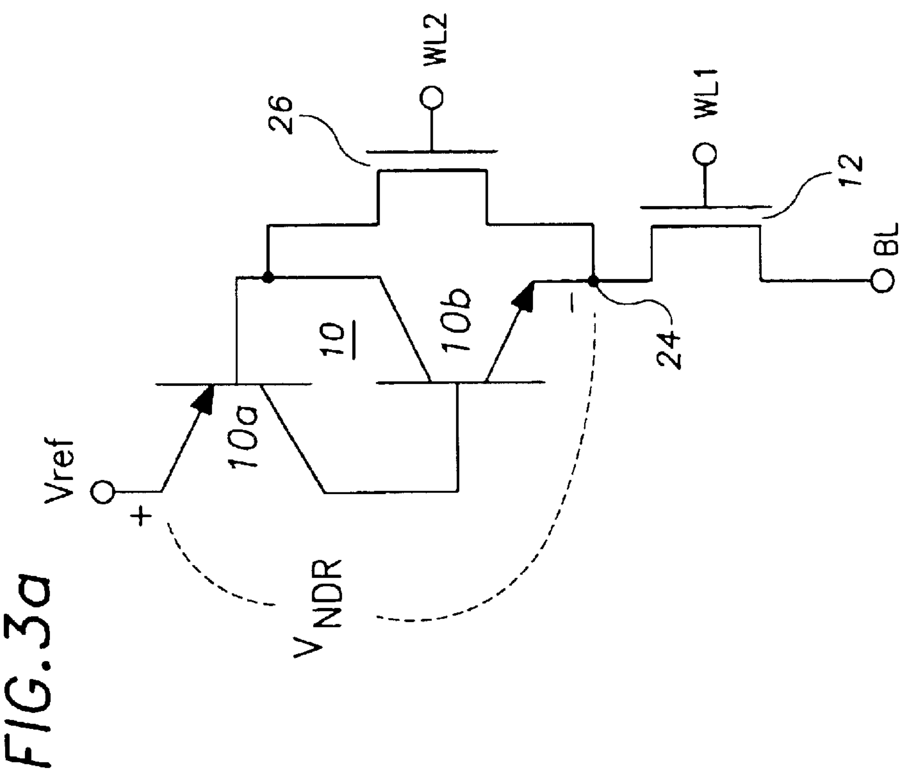

FIGS. 3*a* and 3*b* respectively illustrate DC and AC circuit models of the example arrangement of FIG. 1, shown using bipolar-junction transistors 10*a* and 10*b*. In each of the models, WL2 is shown capacitively coupled to the NDR device 10 at a P region to enhance, and thereby speed up, the switching of current between the terminals of the NDR device. At DC and low frequencies and for the example when the plate 20 overlaps the upper and lower N and N+ regions (FIG. 3*a*), the adjacent gate (20 of FIG. 1) is modeled as a vertical MOSFET 26 connecting the base of the PNP transistor 10*a* to the bit-line (BL) via the pass transistor. The function of the plate to enhance switching of the NDR device is independent of MOS inversion channel formation at high frequencies or when there is no gate overlap. The equivalent circuit model of the cell is shown in FIG. 3*b*, simplified to a capacitive coupling between WL2 and the P region of the PNPN.

Figure 4:
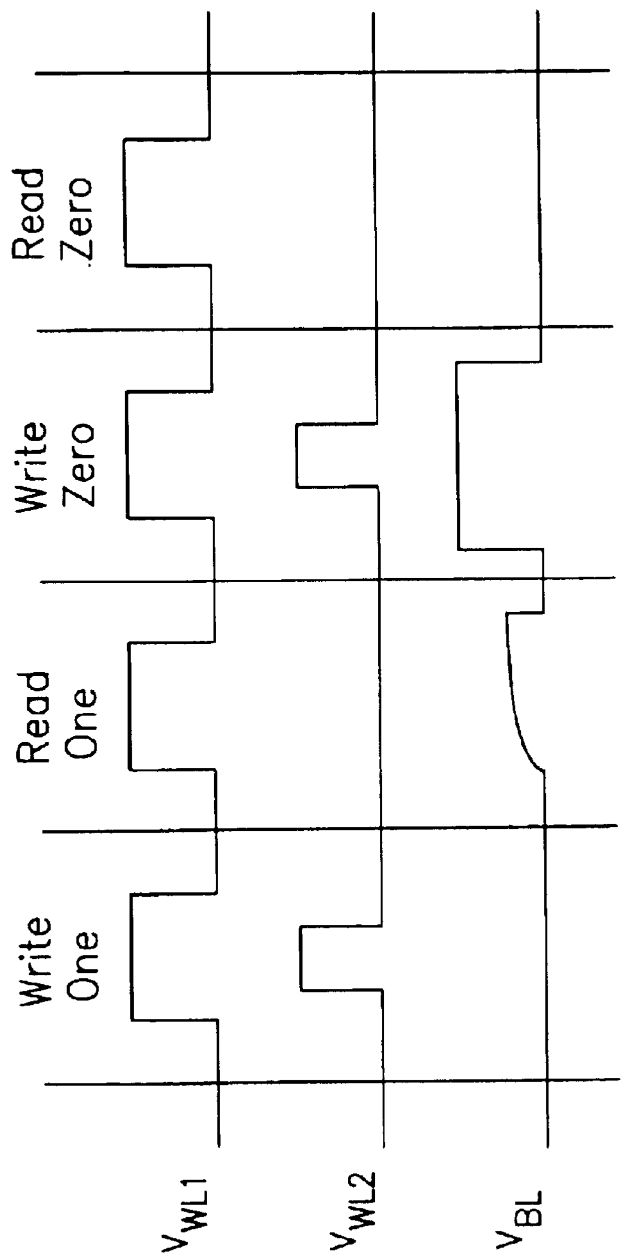
FIG. 4 is a timing diagram showing waveforms of various nodes of the circuit of FIG. 1, according to an example operation that is consistent with the present invention.

FIG. 4 is a timing diagram showing waveforms of various nodes of the circuit of FIG. 1, according to another aspect of the present invention. The diagram shows example read and write-operations for this cell. For the read operation, WL1 is used to read the voltage of the storage node 24.

For the write One operation, the bit line stays low. After WL1 is raised to its high level, a pulse is applied to WL2. The rising edge of this pulse raises the potential of the P region by capacitive coupling and makes the NP and lower PN junctions forward biased which, in-turn, starts the well-known regenerative process in the PNPN and turns the NDR device on.

For the write Zero operation, BL is raised to its high level and WL1 becomes active. This charges the level at the storage node to a high voltage level and moves the NDR device out of the strong forward biased region. A pulse is then applied to WL2. The capacitive coupling between WL2 and the middle P region results in an outflow of the minority charges from the middle P region of the PNPN on the falling edge of the WL2 pulse and blocks the current pass. In this embodiment, this is done only when the PNPN device is "thin". The PNPN is switched to the blocking state after this operation. This turn-off operation does not depend on the normal turn-off mechanism in a multiple PN device (recombination of the minority charges inside the device) and therefore is fast and reliable.

Figure 5:
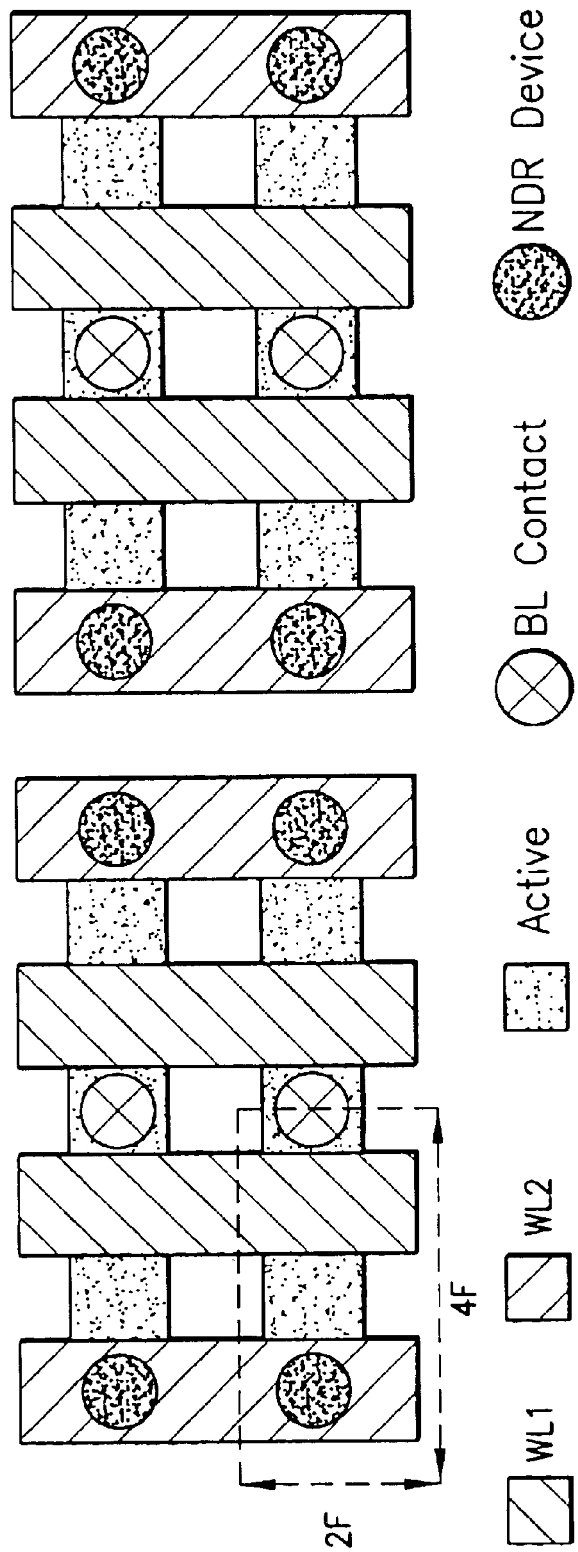
FIG. 5 is a layout arrangement of the example arrangement of FIG. 1 consistent with the present invention.

FIG. 5 is an example layout arrangement of the structure of FIG. 1, according to another aspect of the present invention. An important advantage of the structure of FIG. 1 is its considerably smaller cell area compared to conventional SRAM cells. This layout and structure can be implemented to consume a reasonable level of standby power, and to provide insensitivity to varying voltage levels, good noise margins and high speed. The structure of FIG. 5 is similar to conventional DRAMs in terms of architecture, speed, and the fabrication process. Further, in terms of the circuit real estate, the footprint of the cell shown in FIG. 5 is as small as the footprint of many conventional DRAM cells.

The fabrication of this cell structure can be based on CMOS technology with an additional epitaxial growth step to build the PNPN device, and this process can be similar to conventional stacked capacitor cells with the capacitance being replaced by the NDR device. According to one specific embodiment, the spacing between the bottom of each gate and the top of the NDR device is adjusted by a timed over-etch of the deposited poly. The gate adjacent to the PNPN device can be readily fabricated using well-known methods, including sidewall spacer or selective epitaxy methods. In a more specific embodiment, the gate(s) adjacent to the PNPN device is (are) fabricated using an anisotropic poly etch. The NDR device can be fabricated either before the planar device by etching silicon pillars and ion-implantation or after the planar device, for example, by selective epitaxial growth techniques.

Figure 6:
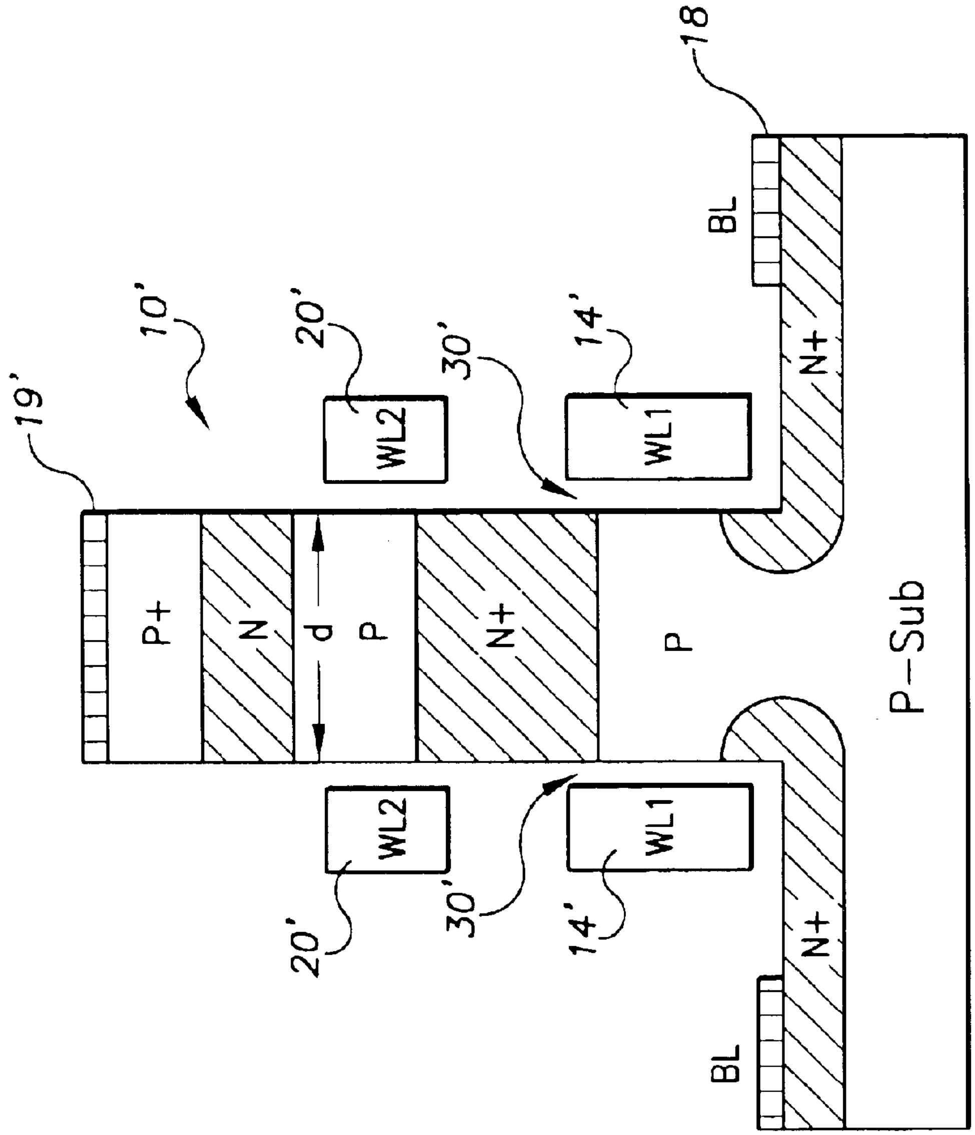
FIGS. 6 and 6*a* illustrate additional examples of capacitively coupled NDR devices, according to the present invention, which can be used as alternatives to the structure shown in FIG. 1.

FIG. 6 illustrates an alternative implementation to that which is shown in FIG. 1. The structures of FIGS. 1 and 6 differ in that the structure of FIG. 6 includes a vertically-arranged NMOSFET 30 instead of the NMOSFET 12 of FIG. 1, which is arranged in a planar manner relative to the P substrate. The NMOSFET 30 includes a gate 14' that at least partially surrounds the P region of the body of the NMOSFET 30. The read and write operations for this embodiment are as shown in FIG. 4. The embodiment of FIG. 6 can be implemented in a smaller area using a more involved fabrication process.

Figure 6A:
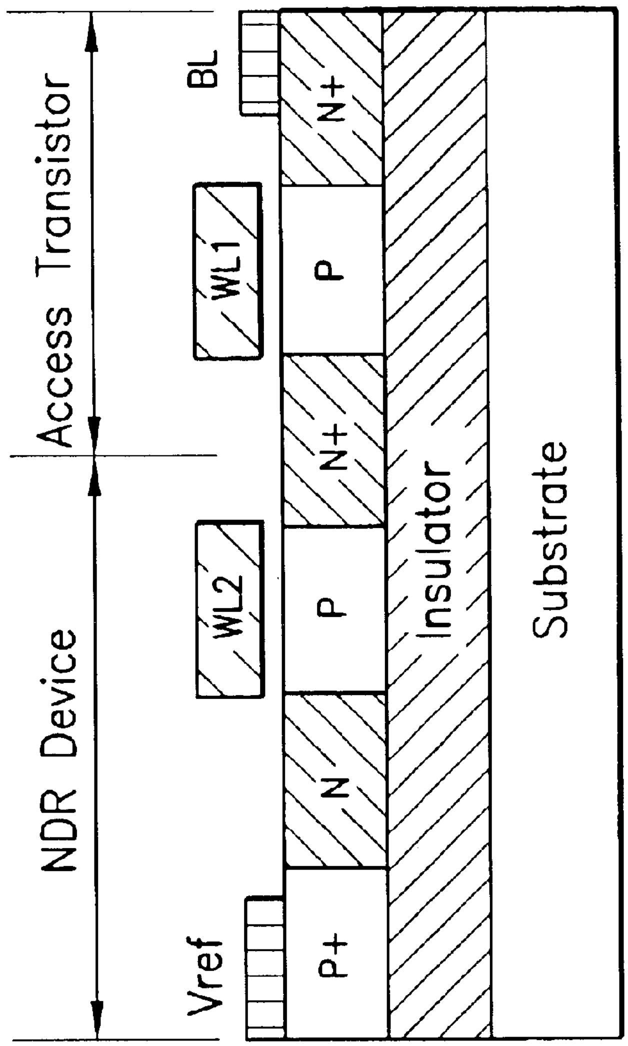

According to one embodiment, the gate for each of the structures of FIGS. 1 and 6 are adjacent to, and of sufficient size relative to, the facing region of the NDR device, so that the voltage transitions at the gate change the potential across the entire diameter ("d") of the subject region of the NDR device. Accordingly, this result is realized by selecting the thickness (as exemplified by "d") of the NDR device along with the size and proximity of the gate to facing region, as well as the doping concentration of the facing region of the NDR device. In one alternate embodiment, the gate only partially surrounds the facing region of the NDR device and the NDR device has a reduced thickness to offset the reduced capacitive coupling provided by the non-surrounding gate. FIG. 6*a* shows an example embodiment of a non-surrounding gate NDR device according to present invention in an SRAM cell arrangement similar to FIG. 1. Thin film SOI (Silicon on Insulator) technology is employed and the PNPN-type NDR device has a planar structure rather than the vertical structure in FIG. 1. The read and write operations for this embodiment are as shown in FIG. 4. In each of the above-mentioned structures, the NDR device can be implemented using any of a variety of shapes.

Figure 7:
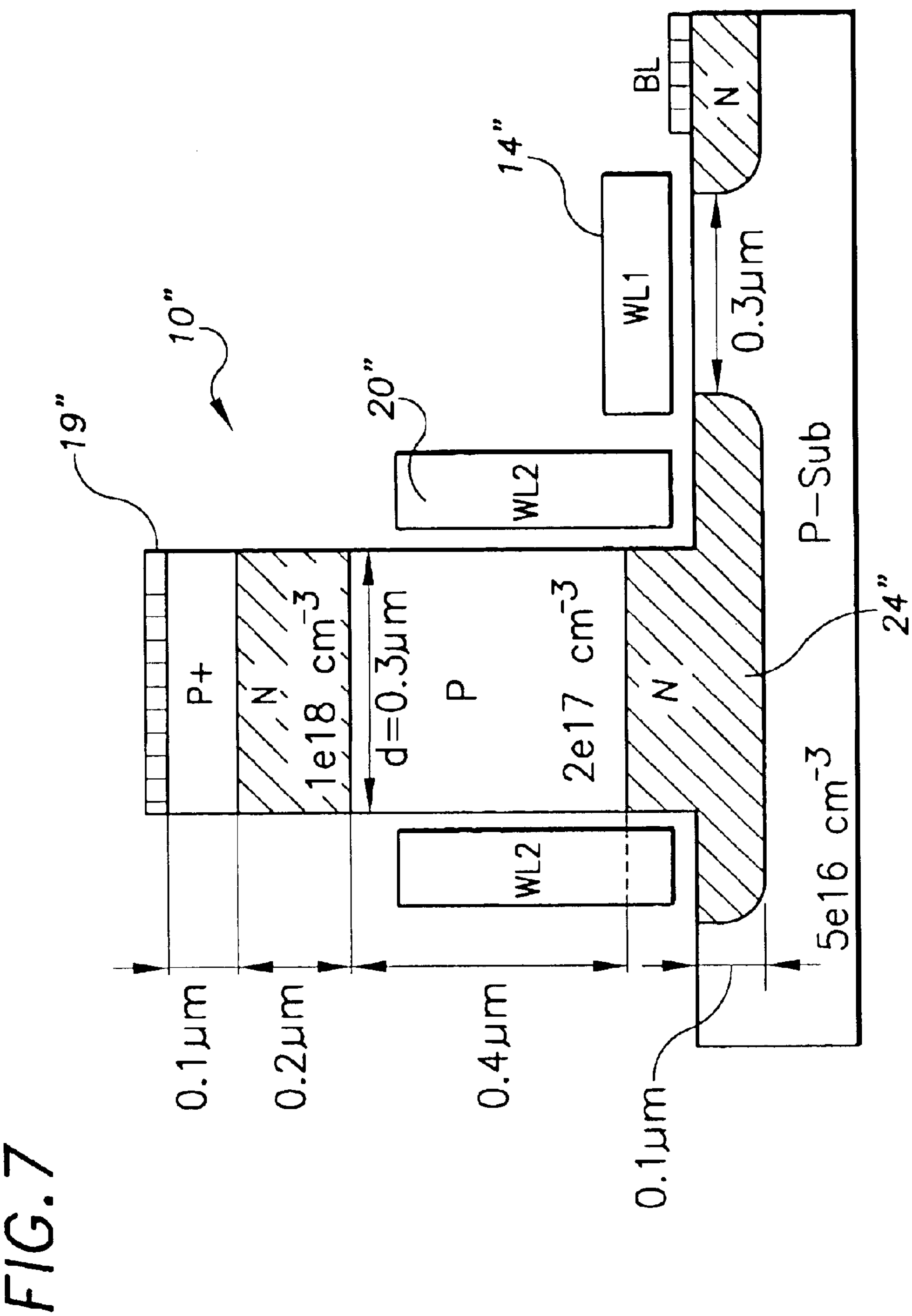
FIG. 7 illustrates another example capacitively coupled NDR device, according to the present invention.

A specific example embodiment uses a supply voltage of one volt (1 V), with each gate being N+ doped and with an oxide layer having a thickness of 200 A. The dimensions of this example SRAM structure are shown in FIG. 7. The surrounding gate 20" (WL2) overlaps with the N region of the internal storage node 24, but not with the upper N region. The NDR device 10" is relatively thin, (0.3 um in this example embodiment) so that the gate has tight control on the potential of the P region of the NDR device 10" and this potential can be readily modulated by the capacitive coupling to the gate 20". In standby mode, BL and WL1 are kept at zero volts and WL2 is kept at minus one volt. If the PNPN device is off, the voltage level at the storage node is at zero volts. If the PNPN device is on, the voltage level at the storage node is about 0.4 V to 0.5 V. The threshold voltage of the access transistor is designed so that the holding current of the PNPN is provided by the subthreshold current of the access transistor. This holding current can be as low as pico-amps per $um^2$. The read and write operations are generally as described in connection with FIG. 4, with the upper voltage levels for WL1 at three volts (3 V), for BL at two volts (2 V), and for WL2 (or gate) being two volts (2 V).

According to another example embodiment and application of the capacitively coupled NDR device, a 1-Gigabit SRAM includes cells implemented consistent with the above two-element NDR-based structure (of either FIG. 1, FIG. 6 or FIG. 6*a*) and is implemented using 0.2 $\mu$m technology with standby current operating at less than 10 mA. Conventional logic circuitry (not shown) is used to control the timing and levels of the access signals (the word and bit lines).

Figure 8:
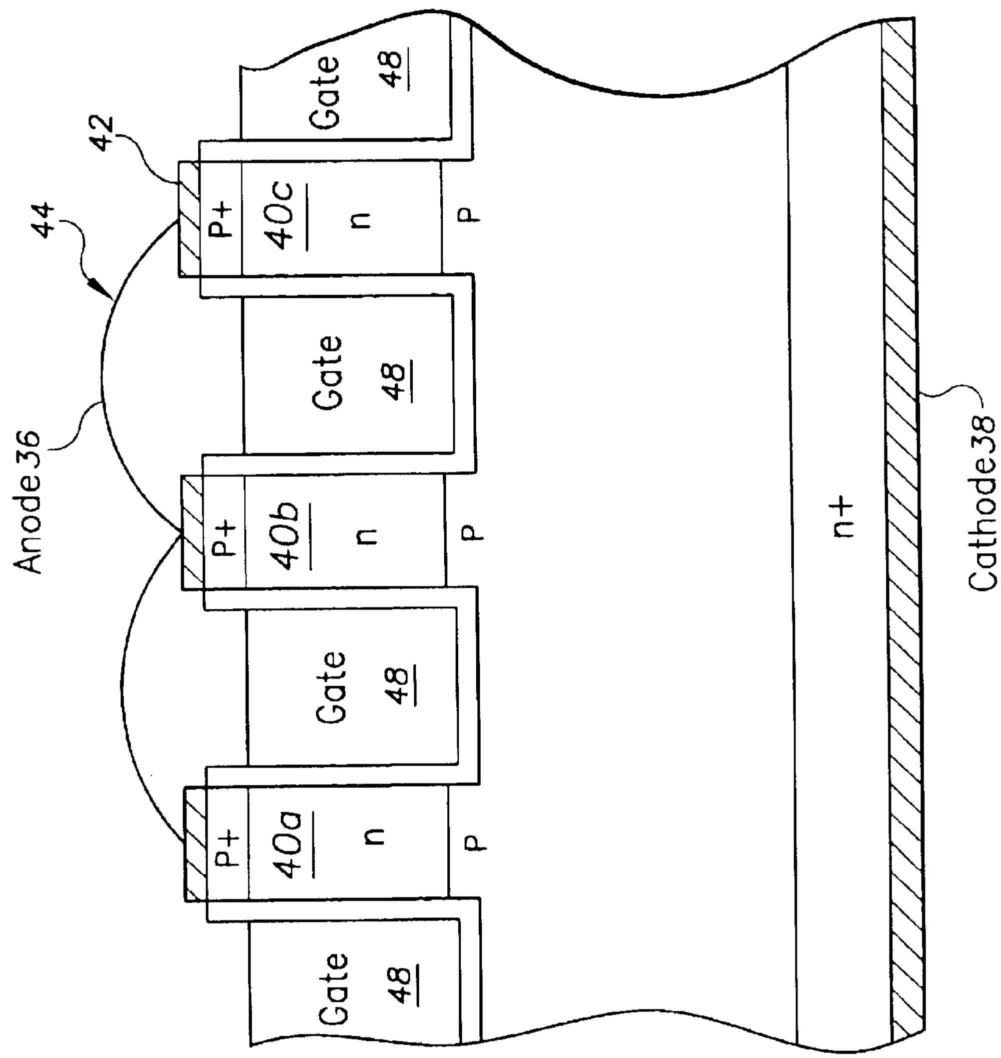
FIG. 8 is a power switch structure, according to another example embodiment of the present invention.

FIG. 8 is a power thryristor structure, according to another example embodiment of the present invention, having a common anode 36 and a common cathode 38 as its connecting terminals. The respective anodes of these devices are implemented using a metalization layer 42 interconnected by a conductor 44. The structure includes a plurality of PNPN-type NDR devices, three of which are depicted as 40*a*, 40*b* and 40*c* and each sandwiched between the common anode 36 and cathode 38. These NDR devices can be cells, stripes or different combinations of cells and/or stripes in the top view layout. Each of the plurality of PNPN-type NDR devices is constructed in a manner similar to the structure of FIG. 1, however, with respective control ports being provided by interconnected charge plates (or gates) 48 primarily adjacent to the upper N region of each PNPN-type NDR device. The power thyristor quickly changes between a current-passing mode and a current-blocking mode in response to an activation signal presented to the interconnected charge plates 48. This approach is advantageous since a quick state change is realized using a relatively low voltage. Moreover, this form of power thyristor can be readily expanded in terms of the number of NDR devices for high power applications or reduced in number for lower power applications.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes include, but are not necessarily limited to: altering the shapes, locations, and sizes of the illustrated gates; adding structures to the capacitively coupled NDR device; increasing the number of PN sections in the current-switching device; and interchanging P and N regions in the device structures and/or using PMOSFETS rather than NMOSFETS. Such modifications and changes do not depart from the true spirit and scope of the present invention that is set forth in the following claims.

What is claimed is:

1. A memory cell comprising:

a thyristor device including doped regions of opposite polarity;

a first word line providing read and write access to the memory cell; and a second word line located adjacent to and separated by an insulative material from at least one of the doped regions of the thyristor device and used for write operation to the memory cell by enhancing the switching of the thyristor device from a high conductance state to a low conductance state and from the low conductance state to the high conductance state.

2. The memory cell of claim 1, further comprising a transistor, wherein the read and write access is provided by the transistor with its gate forming at least part of the first word line.

3. The memory cell of claim 2, wherein the transistor is a MOSFET transistor.

4. The memory cell of claim 1, wherein the second word line enhances the switching of the thyristor device by substantially improving the switching speed of the thyristor device from the high conductance state to the low conductance state.

5. The memory cell of claim 1, wherein the second word line is adapted to enhance the switching of the thyristor device by substantially reducing the voltage requirement of the thyristor device for switching from the low conductance state to the high conductance state.

6. The memory cell of claim 1, wherein at least part of the cell is arranged in a vertical configuration extending above a substrate surface.

7. The memory cell of claim 1, wherein at least part of the cell is arranged in a vertical configuration extending below a substrate surface.

8. The memory cell of claim 1, wherein at least part of the cell is arranged in a planar configuration parallel to a substrate surface.

9. The memory cell of claim 8, wherein the substrate surface is part of a silicon-on-insulator substrate.

10. The memory cell of claim 2, wherein the transistor and the thyristor device are arranged in a planar configuration parallel to a substrate surface.

11. The memory cell of claim 10, wherein the substrate surface is part of a silicon-on-insulator substrate.

12. A memory array comprising:

a first and a second word line; and a plurality of memory cells, each memory cell comprising a thyristor device including doped regions of opposite polarity, wherein the first word line providing read and write access to the memory cell; and a portion of the second word line located adjacent to and separated by an insulative material from at least one of the doped regions of the thyristor device and used for write operation to the memory cell by enhancing the switching of the thyristor device from a high conductance state to a low conductance state and from the low conductance state to the high conductance state.

13. The memory array of claim 12, wherein the memory cell further comprises a transistor, and wherein the read and write access is provided by the transistor with its gate forming at least part of the first word line.

14. The memory array of claim 13, wherein the transistor is a MOSFET transistor.

15. The memory array of claim 12, wherein the second word line enhances the switching of the thyristor device by substantially improving the switching speed of the thyristor device from the high conductance state to the low conductance state.

16. The memory array of claim 12, wherein the second word line enhances the switching of the thyristor device by substantially reducing the voltage requirement of the thyristor device for switching from the low conductance state to the high conductance state.

17. The memory array of claim 12, wherein at least part of the memory cell is arranged in a vertical configuration extending above a substrate surface.

18. The memory array of claim 12, wherein at least part of the memory cell is arranged in a vertical configuration extending below a substrate surface.

19. The memory array of claim 12, wherein at least part of the memory cell is arranged in a planar configuration parallel to a substrate surface.

20. The memory array of claim 19, wherein the substrate surface is part of a silicon-on-insulator substrate.

21. The memory array of claim 13, wherein the transistor and the thyristor device are arranged in a planar configuration parallel to a substrate surface.

22. The memory array of claim 21, wherein the substrate surface is part of a silicon-on-insulator substrate.

* * * * *